United States Patent [19]
Kawahara

[11] Patent Number: 6,005,441
[45] Date of Patent: Dec. 21, 1999

[54] AMPLIFYING CIRCUIT

[75] Inventor: Tadashi Kawahara, Tokyo, Japan

[73] Assignee: Mitsubishi Denki Kabushiki Kaisha, Tokyo, Japan

[21] Appl. No.: 09/084,020

[22] Filed: May 26, 1998

[30] Foreign Application Priority Data

Jan. 21, 1998 [JP] Japan ................................. 10-009811

[51] Int. Cl.⁶ ............................. H03F 3/191; H03F 1/34
[52] U.S. Cl. ......................... 330/294; 330/302; 330/307
[58] Field of Search ............................ 330/65, 66, 98, 330/99, 294, 302, 307, 310, 311

[56] References Cited

U.S. PATENT DOCUMENTS 5,051,705  9/1991  Moghe et al. ..................... 330/294 X
5,117,203  5/1992  Tennyson ............................. 330/294

FOREIGN PATENT DOCUMENTS 0041963    4/1978   Japan ..................................... 330/294
60-177710  9/1985   Japan .
60-189304  9/1985   Japan .
60-248009  12/1985  Japan .
0051704    2/1989   Japan ..................................... 330/294
7263977    10/1995  Japan .

Primary Examiner—Steven J. Mottola
Attorney, Agent, or Firm—Leydig, Voit & Mayer, Ltd.

[57] ABSTRACT

An amplifying circuit has a feedback reactance element connected across a biasing feedback resistor and an input terminal for suppressing feedback of thermal noise generated by the biasing feedback resistor.

4 Claims, 4 Drawing Sheets

# AMPLIFYING CIRCUIT

BACKGROUND OF THE INVENTION

1. Field of the Invention

The present invention relates to an amplifying circuit suitably used for high-frequency radio devices such as a portable telephone set. In particular, the present invention relates to an amplifying circuit which can be stably used, even when formed on a silicon substrate, for a portable telephone set as a first stage amplifying circuit to which signals received by a receiving antenna are directly input.

2. Description of the Prior Art

FIG. 1 is a circuit diagram showing a prior art amplifying circuit disclosed in JP-A No. 7-263977. In FIG. 1, reference numeral 16 indicates an input terminal through which an input signal of a predetermined frequency is input to the amplifying circuit; 17 indicates an output terminal from which a signal amplified by the amplifying circuit is output; 18 indicates a first stage NPN type transistor having a base electrode connected to the input terminal 16 through a reactance element 20, an emitter electrode grounded, and a collector electrode connected to a high voltage side power supply of the amplifying circuit through a first stage load resistor 19; 31 indicates a second stage NPN type transistor having a base electrode connected to the collector electrode of the first stage NPN type transistor 18, an emitter electrode grounded through an emitter register 33, and a collector electrode connected to the output terminal 17 and the high voltage side power supply through a second stage load register 32; 19 indicates the first stage load resistor connected across the collector electrode of the first stage NPN type transistor 18 and the high voltage side power supply; 32 indicates the second stage load resistor connected across the collector electrode of the second stage NPN type transistor 31 and the high voltage side power supply; 33 indicates the emitter resistor connected across the emitter electrode of the second stage NPN type transistor 31 and a ground potential; and 20 indicates a matching reactance element connected across the input terminal 16 and the base electrode of the first stage NPN type transistor 18 to match an input impedance from the viewpoint of the input terminal 16 with a predetermined impedance. A voltage generated at the emitter resistor 33 is fed-back to the node between the input terminal 16 and the matching reactance element 20.

The operation of the prior art amplifying circuit will be described hereinafter.

When an input signal of a predetermined frequency is inputted into the input terminal 16, since impedance matching is established by the matching reactance element 20, a signal having an amplitude equal to that of the input signal is inputted into the base electrode of the first stage NPN type transistor 18. And, the first stage NPN type transistor 18 amplifies an input voltage in an inverted phase. The second stage NPN type transistor 31 also amplifies an output voltage from the first stage NPN type transistor 18 in an inverted phase. Accordingly, an amplified signal of the same phase as that of the input signal applied to the input terminal 16 is outputted from the output terminal 17.

Since a voltage of a phase inverted to that of the input signal is basically generated at the emitter resistor 33 and is fed-back to the node between the input terminal 16 and the matching reactance element 20, an amplification factor of the amplifying circuit is suppressed by the negative feedback, to thereby realize a stable operation of the amplifying circuit without oscillation. Incidentally, the amplitude of the amplified signal is basically equal to an amplitude calculated by multiplying the amplitude of the input signal by the product of the amplification factor of the first stage of the NPN type transistor 18 and that of the second stage NPN type transistor 31.

FIG. 2 is a circuit diagram showing another prior art amplifying circuit disclosed in JP-A No. 7-263977. In this figure, reference numeral 42 indicates a feedback matching reactance element connected across an input terminal 16 and the emitter resistor 33 for matching an input impedance from the viewpoint of the input terminal 16 with a predetermined impedance. Other configurations are the same as those shown in FIG. 1, and therefore, parts corresponding to those shown in FIG. 1 are indicated by the same characters and the explanation thereof will be omitted.

With this configuration, even if a phase of the output signal is not just inverted to a phase of the input signal due to the impedance of a signal passage of the amplifying circuit, the phase of the output signal can be accurately adjusted to be inverted to the phase of the input signal, thus achieving effective feedback. In addition, as the feedback matching reactance element 42 used for such a purpose, like the matching reactance element 20, there is used a reactance element having an inductance of several nH if the frequency of the input signal is in the 800 MHz band.

Each of the prior art amplifying circuits having the above configurations has a problem that it cannot amplify signals of frequencies in the 800 MHz band used for portable telephone at a low noise level unless the amplifying circuit is monolithically formed on an expensive GaAs substrate having an insulation resistance higher than that of a silicon substrate.

Problems in the prior art amplifying circuits will be specifically described below.

When passive elements, such as resistor elements and reactance elements, are formed on a substrate for semiconductor devices, a parasitic capacitance formed between the substrate and the wiring pattern for connecting the passive elements exhibits a high-frequency wave cutting off characteristic. With respect to the capacity of the parasitic capacitance, the cut-off frequency of the parasitic capacitance formed on a silicon substrate is lower than that of the parasitic capacitance formed on a GaAs substrate. Therefore, if the above amplifying circuit is formed on a silicon substrate, it cannot amplify even an input signal of a frequency in the order of 800 MHz and −110 dBm with a low level of noises.

The emitter resistor generates thermal noises when a bias voltage is applied. The level of noises inputted to the base electrode of the first stage NPN type transistor is raised by the thermal noise generated by the emitter resistor. As a result, even if the input signal of a frequency in the order of 800 MHz and about −110 dBm cannot be amplified at a sufficient signal-to-noise ratio (hereinafter referred to as "S/N ratio"). In particular, in an amplifying circuit composed with impedance matching of a 50Ω system to transmit high-frequency signals, since the impedance of the matching reactance element and the feedback matching reactance element is small, the rise of the level of input noises due to feedback cannot be effectively suppressed.

SUMMARY OF THE INVENTION

Accordingly, it is an object of the present invention to provide an amplifying circuit capable of effectively suppressing the rise of the level of input noise, thereby amplifying even an input signal of a frequency in the order of 800 MHz and about −110 dBm with a sufficient S/N ratio even if the amplifying circuit is formed on a silicon substrate.

To achieve the above object, according to a first aspect of the present invention, there is provided an amplifying circuit including: one stage or a plurality of stages of junction transistors cascaded to each other between an input terminal and an output terminal, a matching reactance element connected across the input terminal and the base electrode of the first stage junction transistor to match an input impedance from the viewpoint of the input terminal with a predetermined impedance, a feedback resistor for feeding back a signal of a phase inverted to the phase of the input signal to the node between the input terminal and the matching reactance element, and a feedback reactance element connected in series to the feedback resistor to prevent the feedback of an ac component. According to this aspect, the feedback reactance element prevents thermal noise generated by the feedback resistor when a bias is applied from being inputted to the base electrode of the first stage junction transistor. This is effective to suppress noise generation in the amplifying circuit. Therefore, even if the amplifying circuit is monolithically formed on a silicon substrate, the amplifying circuit has a predetermined high-frequency signal amplifying characteristic.

According to a second aspect of the present invention, there is provided an amplifying circuit in which the impedance of the feedback reactance element is greater than that of the matching reactance element. This is effective to obtain the amplifying circuit having a large S/N ratio.

According to a third aspect of the present invention, there is provided an amplifying circuit monolithically formed on a silicon substrate, in which the matching reactance element and the feedback reactance element are formed as spiral inductors formed by coplanar type wiring pattern. This is effective to obtain the amplifying circuit capable of obtaining a predetermined gain with a sufficiently large S/N ratio even for signals of frequencies in the 800 MHz band used by portable telephone, and of receiving input signals directly from an antenna.

According to a fourth aspect of the present invention, there is provided an amplifying circuit monolithically formed on a silicon substrate, in which the matching reactance element and the feedback reactance element are formed as comb-shaped inductors formed by coplanar type wiring pattern. This is effective to obtain the amplifying circuit capable of stably amplifying even input signals of frequencies in the 800 MHz band with a large S/N ratio, and of receiving input signals directly from a transmitting/receiving antenna.

According to a fifth aspect of the present invention, there is provided an amplifying circuit further including an impedance element for applying a bias voltage to the node between the input terminal and the matching reactance element. With this configuration, since the operating point of the amplifying circuit can be optionally set, the transistors can be made to operate in an optimum state at a bias level corresponding to the level of input signals.

BRIEF DESCRIPTION OF THE DRAWINGS

Other objects and advantages of the present invention will be apparent from the following detailed description taken in connection with the accompanying drawings.

DETAILED DESCRIPTION OF THE PREFERRED EMBODIMENTS

Hereinafter, preferred embodiments of the present invention will be described with reference to the accompanying drawings.

Embodiment 1

Figure 1:
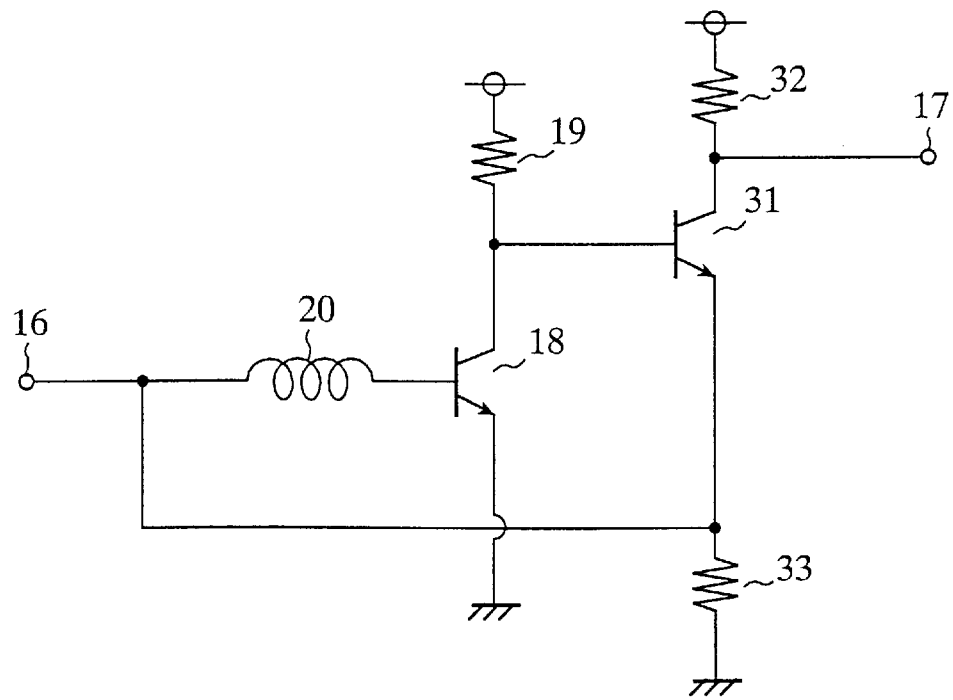
FIG. 1 is a circuit diagram showing a prior art amplifying circuit.
Figure 2:
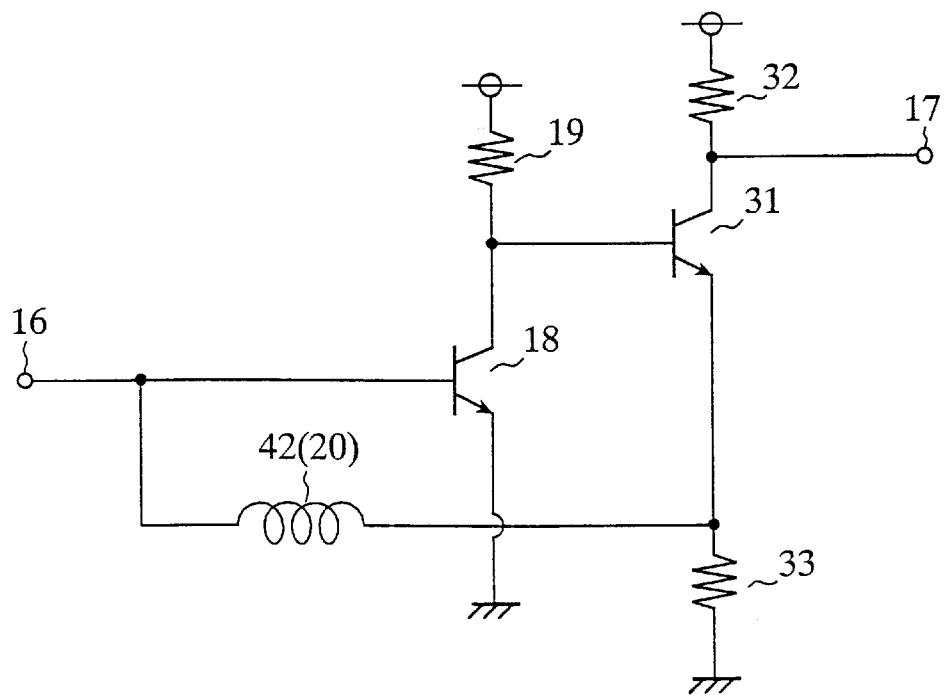
FIGS. 2 is a circuit diagram showing another prior art amplifying circuit.
Figure 3:
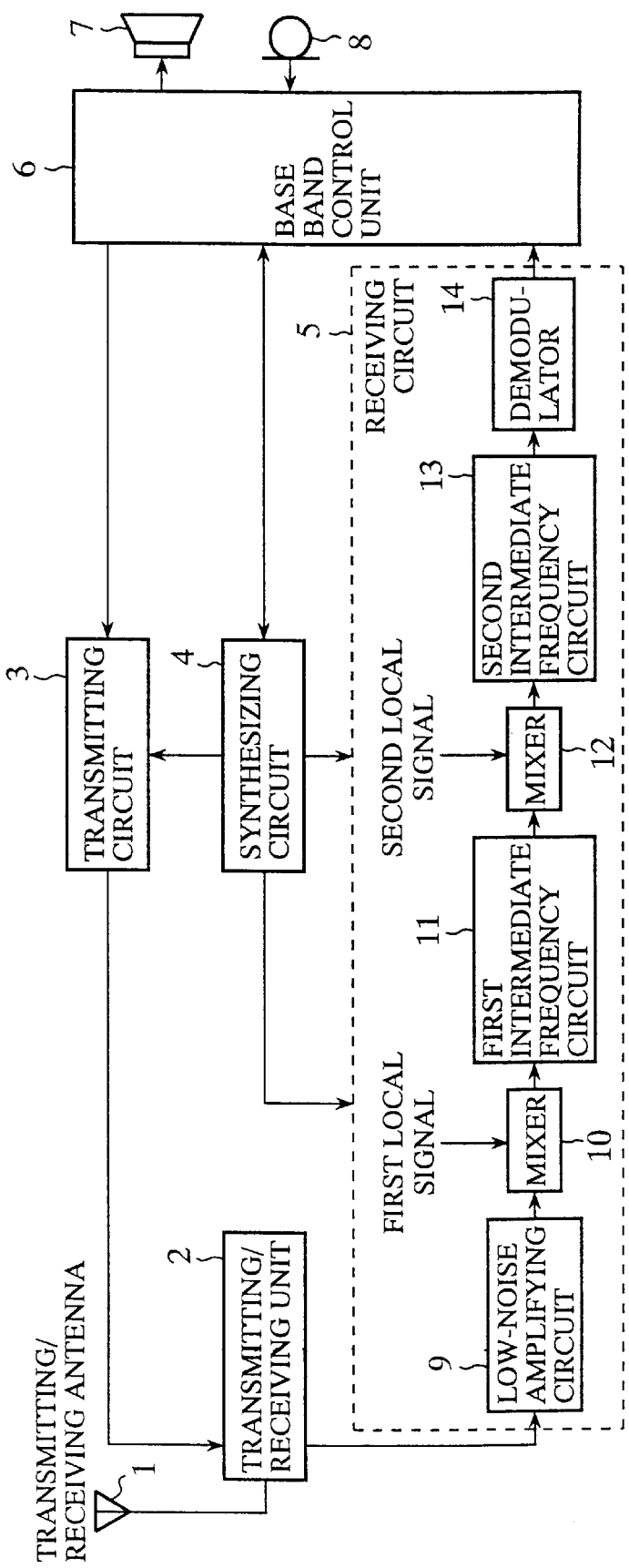
FIG. 3 is a block diagram showing a configuration of an 800 MHz band portable telephone set according to a first embodiment (Embodiment 1) of the present invention.

FIG. 3 is a block diagram showing an 800 MHz band portable telephone set according to Embodiment 1 of the present invention. In this figure, reference numeral 1 indicates a transmitting/receiving antenna for transmitting/receiving signals on radio communication; 7 indicates a loudspeaker for generating audio signals reproduced from received signals; 8 indicates a microphone into which audio signals to be transmitted are inputted; 6 indicates a base band control unit for converting audio signals into transmitting signals and received signals in accordance with a time division multiple access system (hereinafter referred to as "TDMA system"); 3 indicates a transmitting circuit for subjecting transmitting signals to frequency conversion to allow the transmitting signals to be transmitted through the transmitting/receiving antenna 1; 5 indicates a receiving circuit for subjecting received signals to frequency conversion to allow the received signals to be reproduced by the base band control unit 6; 2 indicates a transmitting/receiving unit for mixing the above transmitting signals and received signals and transmitting/receiving them by the transmitting/receiving antenna 1; 4 indicates a synthesizing circuit for synchronizing the operations of the transmitting circuit 3, the receiving circuit 5 and the base band control unit 6 with each other.

In FIG. 3, reference numeral 9 indicates a low-noise amplifier for amplifying received signals of frequencies in the 800 MHz band; 10 indicates a first mixer for mixing a signal of 950 MHz supplied by the synthesizing circuit 4 with the received signal to reduce the frequency of the received signal to a frequency in the 130 MHz band; 11 indicates a first intermediate frequency circuit which passes only signals of a predetermined frequency; 12 indicates a second mixer for mixing a signal supplied by the synthesizing circuit 4 with the received signal to further reduce the frequency of the received signal; 13 indicates a second intermediate frequency circuit which passes only signals of a predetermined frequency; 14 indicates a demodulator for demodulating signals received from the second intermediate frequency circuit to audio signals.

Figure 4:
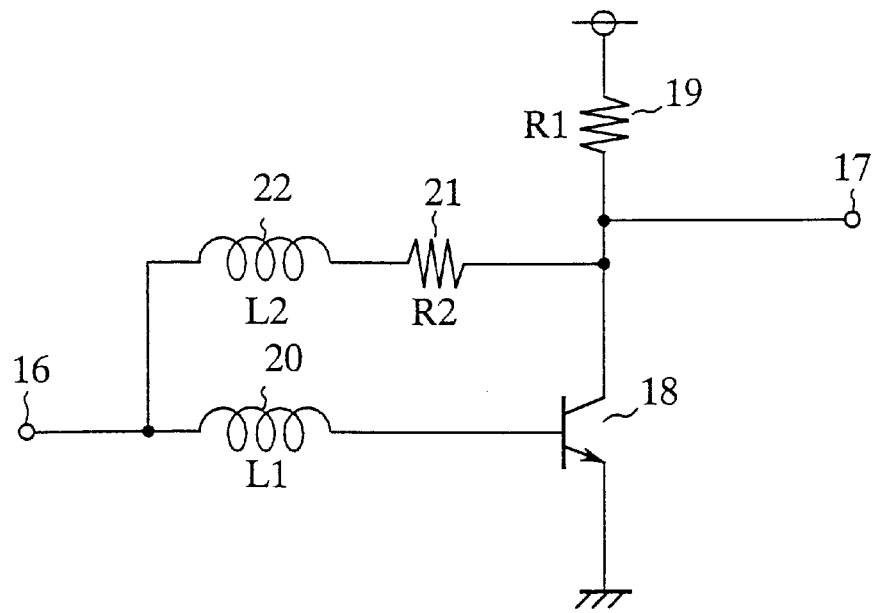
FIG. 4 is a circuit diagram showing a detailed configuration of a low-noise amplifying circuit according to Embodiment 1.

FIG. 4 is a circuit diagram showing a detailed configuration of the low-noise amplifier 9 according to Embodiment 1 of the present invention. In addition, the low-noise amplifier 9 is formed on a silicon substrate. In FIG. 4, reference numeral 16 indicates an input terminal for inputting signals of a predetermined frequency in the amplifier 9; 17 indicates an output terminal for outputting signals amplified by the amplifier 9 therefrom; 18 indicates an NPN type transistor having a base electrode connected through a reactance element 20 to the input terminal 16, an emitter electrode connected to a ground, and a collector electrode connected to a high voltage power supply through a load register 19; 19 indicates a load resistor connected across the collector electrode of the NPN type transistor 18 and the high voltage power supply; 20 indicates a matching reactance element connected across the input terminal 16 and the base electrode of the NPN type transistor 18 to match an input impedance from the viewpoint of the input terminal 16 with an impedance of 50Ω; 21 indicates a feedback resistor inserted between the collector electrode of the transistor 18 and a feedback reactance 22 to feed back a signal of a phase inverted to that of the input signal to the input terminal 16; 22 indicates the feedback reactance element connected between the resister 21 and the input terminal 16 to prevent the feedback of ac components.

Figure 5A:
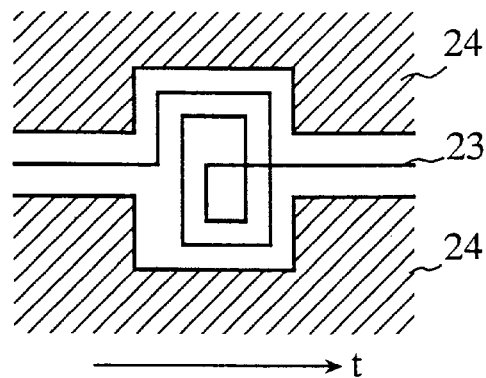
FIGS. 5(a) and 5(b) are a plan view and a sectional view, respectively, showing structures of a matching reactance element and a feedback reactance element according to Embodiment 1.
Figure 5B:
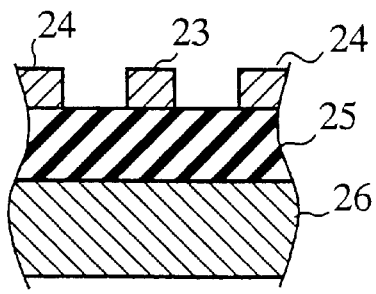

FIGS. 5(*a*) and 5(*b*) are configuration views showing the matching reactance element 20 and the feedback reactance element 22 according to Embodiment 1, wherein FIG. 5(*a*) is a plan view, and FIG. 5(*b*) is a sectional view. In these figures, reference numeral 26 indicates a silicon substrate; 25 indicates an insulating film laminated on the silicon substrate 26; 23 indicates a signal line laminated on the insulating film 25 in a spiral shape to form the matching reactance element 20 and the feedback reactance element 22; 24 indicates a ground line laminated on the insulating film 25 so as to surround the signal line 23. In addition, the matching reactance element 20 is formed to exhibit an inductance of 3 nH, and the feedback reactance element 22 is formed to exhibit an inductance of 1 H.

The operation of the portable telephone set will be described below.

Upon the start of communication, operations for transmitting and receiving signals, such as audio signals, by the TDMA system are started. The base band control unit 6 converts audio signals inputted by the microphone 8 into predetermined transmitting signals, and the transmitting signals are outputted from the transmitting/receiving antenna 1 through the transmitting circuit 3 and the transmitting/receiving circuit 2. Signals received by the transmitting/receiving antenna 1 are converted into audio signals by the base band control unit 6 through the transmitting/receiving circuit 2 and the receiving circuit 5, and then outputted from the loudspeaker 7.

During the series of operations, the low-noise amplifier 9 monolithically formed on the silicon substrate 26 amplifies received signals in the 800 MHz band by the NPN type transistor 18. In this case, since feedback is made through the feedback resistor 21 and thermal noise generated by the feedback resistor 21 is intercepted by the feedback reactance element 22, the received signals can be stably amplified without raising the noise level thereof.

Since the reactance elements 20 and 22 are formed by coplanar type wiring pattern, the deterioration of transmittance characteristic at a high-frequency due to a parasitic capacitance produced between the signal line 23 and the silicon substrate 26 can be suppressed. The reactance elements 20 and 22 are capable of exerting an appropriate impedance to signals in the 800 MHz band.

Consequently, the low-noise amplifier 9 is capable of amplifying signals of frequencies in the order of 800 MHz and about −110 dBm with a sufficiently large S/N ratio, and the loudspeaker 7 reproduces audio signals. Therefore, the portable telephone set exercises excellent performance.

As is apparent from the foregoing description, according to Embodiment 1, the feedback resistor 21 stabilizes the operation of the NPN type transistor 18 and hence the amplifier 9 has a stable amplifying characteristic. The matching reactance element 20 connected across the input terminal 16 and the base electrode of the NPN type transistor 18 matches the input impedance with the impedance of a signal path through which input signals are transmitted, so that the reflection of signals can be prevented. Since the amplifier 9 is provided with the feedback reactance element 22 connected across the feedback resistor 21 and the input terminal 16 in addition to the matching reactance element 20, it is possible to prevent the input of thermal noise generated by the feedback resistor 21 when a bias voltage is applied, to the base electrode of the NPN type transistor 18, and hence to suppress noise generation in the amplifier 9.

Accordingly, although such an amplifying circuit is monolithically formed on the silicon substrate 26, it is allowed to exhibit a predetermined high-frequency amplifying characteristic. In particular, since the reactance elements 20 and 22 are formed as spiral inductors formed by coplanar type wiring pattern, the amplifying circuit is able to obtain a predetermined gain at a sufficiently large S/N ratio even for input signals of frequencies in the 800 MHz band used by portable telephone, and also the amplifying circuit is able to receive input signals directly from the transmitting/receiving antenna 1.

Embodiment 2

Figure 6:
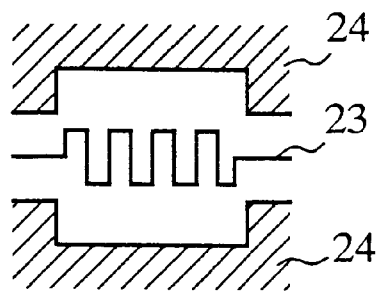
FIG. 6 is a plan view showing structures of a matching reactance element and a feedback reactance element according to a second embodiment (Embodiment 2) of the present invention.

FIG. 6 is a plan view showing a configuration of a matching reactance element 20 and a feedback reactance element 22 according to Embodiment 2 of the present invention. In FIG. 6, reference numeral 23 indicates a signal line laminated in the shape of a comb on an insulating film for forming the matching reactance element 20 and the feedback reactance element 22; 24 indicates a ground line laminated on the insulating film so as to surround the signal line 23. The matching reactance element 20 is formed to exhibit an inductance of 3 nH, and the feedback reactance element 22 is formed to exhibit an inductance of 1 H. Other configurations are the same as those in Embodiment 1, and therefore, parts corresponding to those in Embodiment 1 are indicated by the same characters and the explanation thereof is omitted.

As is apparent from the foregoing description, according to Embodiment 2, since the reactance elements 20 and 22 are formed by the coplanar type signal lines 23 in the shape of a comb, like Embodiment 1, the amplifying circuit is able to amplify input signals of frequencies in the 800 MHz band stably with a sufficiently large S/N ratio, and also the amplifying circuit is able to receive input signals directly from a transmitting/receiving antenna 1.

Embodiment 3

Figure 7:
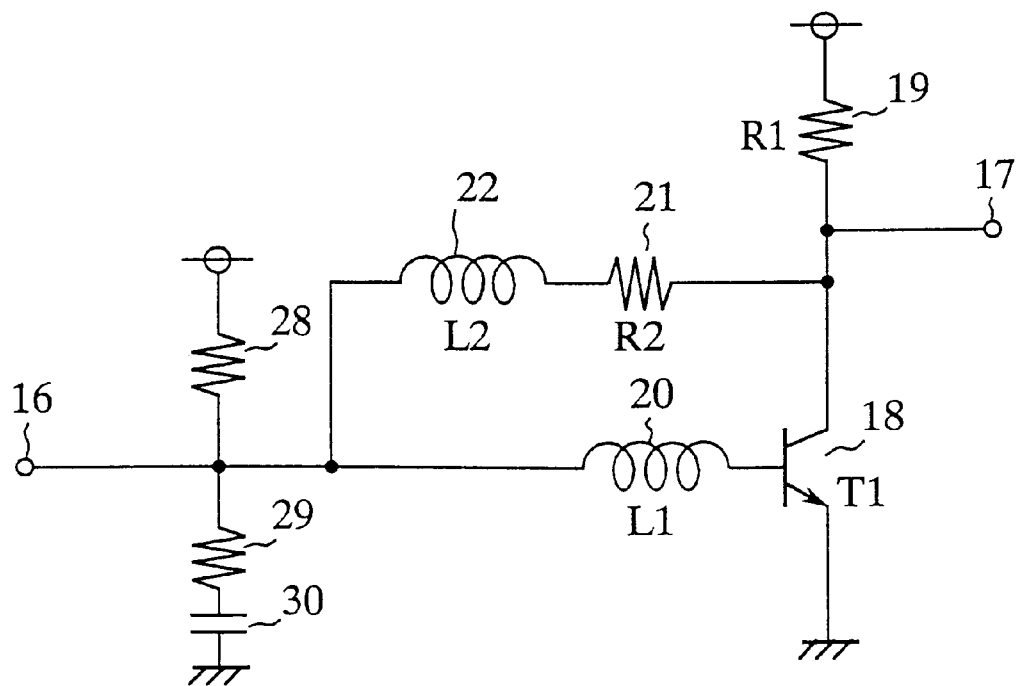
FIG. 7 is a circuit diagram showing a low-noise amplifying circuit according to a third embodiment (Embodiment 3) of the present invention.

FIG. 7 is a circuit diagram showing a detailed configuration of a low-noise amplifier 9 according to Embodiment 3 of the present invention. In addition, the low-noise amplifier is formed on a silicon substrate 26. In FIG. 7, reference numeral 28 indicates a first bias resistor connected across an input terminal 16 and a high voltage power supply; 29 indicates a second bias resistor connected across the input terminal 16 and a bias stabilizing capacitor 30; 30 indicates a bias stabilizing capacitor connected across the second bias resistor 29 and the ground. Other configurations are the same as those in Embodiment 1, and therefore, parts corresponding to those in Embodiment 1 are indicated by the same characters and the explanation thereof is omitted.

With this configuration, the operating point of the NPN type transistor 18 can be set without depending on the current amplification factor $h_{FE}$ of the transistor 18.

As described above, Embodiment 3 has the same effect as that in Embodiment 1, and therefore, the operating point of the amplifier 9 can be optionally set, so that the NPN type transistor 18 can be made to operate properly according to the level of the input signal.

Although the preferred embodiments of the present invention have been described, such description is for illustrative purposes only, and it is to be understood that changes and variations may be made without departing from the spirit or scope of the following claims.

What is claimed is:

1. An amplifying circuit for amplifying an input signal input to an input terminal and outputting an amplified signal from an output terminal, said amplifying circuit comprising:

a junction transistor connected between the input terminal and the output terminal;

a matching reactance element having an impedance and connected between and to the input terminal and a base electrode of the junction transistor for input impedance matching;

a feedback circuit including a resistor and a feedback reactance connected in series for feeding back a signal having a phase inverted relative to the input signal, from the output terminal to a node located between the input terminal and the matching reactance element; and a bias network comprising a first bias resistor connected between and to the input terminal and a power supply terminal and a bias circuit comprising a second bias resistor and a bias stabilizing capacitor connected in series, the bias circuit being connected between and to the input terminal and ground.

2. The amplifying circuit according to claim 1, wherein the feedback reactance element has an impedance larger than the impedance of the matching reactance element.

3. The amplifying circuit according to claim 1, wherein the amplifying circuit is monolithically formed on a silicon substrate, and the matching reactance element and the feedback reactance element are spiral inductors having coplanar wiring patterns.

4. The amplifying circuit according to claim 1, wherein the amplifying circuit is monolithically formed on a silicon substrate, and the matching reactance element and the feedback reactance element are comb-shaped inductors having coplanar wiring patterns.

* * * * *